United States Patent [19]

Yamamoto et al.

[11] Patent Number: 5,486,492
[45] Date of Patent: Jan. 23, 1996

[54] METHOD OF FORMING MULTILAYERED WIRING STRUCTURE IN SEMICONDUCTOR DEVICE

[75] Inventors: Hiroshi Yamamoto; Nobuyuki Takeyasu, both of Chiba; Tomohiro Ohta, Urayasu, all of Japan

[73] Assignee: Kawasaki Steel Corporation, Hyogo, Japan

[21] Appl. No.: 142,971

[22] Filed: Oct. 29, 1993

[30] Foreign Application Priority Data

Oct. 30, 1992 [JP] Japan .................................... 4-293124

[51] Int. Cl.⁶ ..................... H01L 21/285; H01L 21/3065
[52] U.S. Cl. ........................... 437/192; 437/194; 437/195
[58] Field of Search ..................... 437/192, 194, 437/228, 245, 246, 195

[56] References Cited

U.S. PATENT DOCUMENTS

| | | |
|---|---|---|
| 4,666,737 | 5/1987 | Gimpelson et al. . |
| 4,822,753 | 4/1989 | Pintchovski et al. . |
| 4,898,841 | 2/1990 | Ho .................................... 437/200 |
| 4,985,373 | 1/1991 | Levinstein et al. ................ 437/195 |
| 5,043,299 | 8/1991 | Chang et al. . |
| 5,081,064 | 1/1992 | Inoue et al. ....................... 437/190 |
| 5,180,687 | 1/1993 | Mikoshiba et al. ................ 437/187 |
| 5,234,864 | 8/1993 | Kim et al. . |
| 5,354,712 | 10/1994 | Ho et al. ........................... 437/195 |

FOREIGN PATENT DOCUMENTS

| | | |
|---|---|---|
| 62-105422 | 5/1987 | Japan . |
| 63-260051 | 10/1988 | Japan . |
| 0030123 | 1/1990 | Japan . |
| 2-132825 | 5/1990 | Japan . |
| 4-51525 | 2/1992 | Japan . |
| 5347269 | 12/1993 | Japan . |

OTHER PUBLICATIONS

S. R. Wilson et al.; "A High Performance, Four Metal Layer Interconnect System For Bipolar and BICMOS Circuits"; Jun. 12–13, 1990 VMIC Conference; pp. 42–48.

T. Kwok et al.; "Electromigration in a Two–Level Al–Cu Interconnection with W Studs"; Jun. 12–13, 1990 VMIC Conference; pp. 106–112.

C. A. Bollinger et al.; "An Advanced Four Level Interconnect Enhancement Module for 0.9 Micron CMOS"; Jun. 12–13, 1990 VMIC Conference; pp. 21–27.

Primary Examiner—Olik Chaudhuri
Assistant Examiner—C. Everhart
Attorney, Agent, or Firm—Oliff & Berridge

[57] ABSTRACT

A method of forming a via structure having good characteristics in a semiconductor device having a multilayered wiring structure includes forming a thin film including a high melting point metal or a high melting point metal compound on at least the side wall of a via hole before a via plug including Al or an Al alloy is formed.

40 Claims, 12 Drawing Sheets

Fig. 17

| CHARACTERISTICS<br>MATERIALS | (a)<br>LOW-TEMPERATURE FORMATION | (b)<br>ETCH | (c)<br>FILM FORMATION INHIBITION | (d)<br>REACTION |
|---|---|---|---|---|
| POLYCRYSTALINE Si | × | ○ | × | × |
| HIGH MELTING POINT METAL | ○ | △ | ○ | △ |
| HIGH MELTING POINT METAL / Ti, etc. | ○ | ○ | ○ | △ |
| HIGH MELTING POINT METAL SILICIDE | ○ | △ | △ | × |
| PLATINUM-BASED METAL | ○ | × | ○ | × |
| PLATINUM-BASED METAL SILICIDE | ○ | △ | ○ | × |
| HIGH MELTING POINT METAL NITRIDE | ○ | ○ | ○ | ○ |
| HIGH MELTING POINT METAL OXYNITRIDE | ○ | ○ | ○ | ○ |
| HIGH MELTING POINT METAL BORIDE | ○ | ○ | ○ | ○ |
| HIGH MELTING POINT METAL BORONITRIDE | ○ | ○ | ○ | ○ |

○ GOOD, △ FAIR, × POOR

METHOD OF FORMING MULTILAYERED WIRING STRUCTURE IN SEMICONDUCTOR DEVICE

BACKGROUND OF THE INVENTION

1. Field of the Invention

The present invention relates to a multilayered wiring structure in a semiconductor device and, more particularly, to a method of forming a multilayered wiring structure including a via hole. The present invention also relates to a semiconductor device having a characteristic multilayered wiring structure formed by this method.

2. Related Background Art

In recent years, a multilayered wiring technology has received a great deal of attention as a highly integrated high-density semiconductor element. In the multilayered wiring structure, different metal wiring layers are connected by using a via structure. The via structure in the multilayered wiring structure used in a conventional LSI having a design rule of 1 μm or more is formed in the following process. A lower wiring layer is formed on the upper surface of a substrate, and a via hole is formed in an insulating interlayer formed on the lower wiring layer. Thereafter, a metal film is deposited in the via hole and on the insulating interlayer at the same time, and patterned to form an upper wiring layer.

In a micropatterned LSI, however, the yield and reliability of connection are greatly degraded in the via structure formed by this method. This is because the metal film to be formed into the upper wiring layer is normally deposited by using the sputtering method which is poor in step coverage, so that the metal film on the wall surface of the via hole becomes thinner to cause disconnection at this portion.

To solve this problem, for example, a method of forming a via hole into a tapered shape, or a method of improving step coverage by controlling the temperature of the substrate surface during deposition of an aluminum (hereinafter referred to as Al) alloy film to be formed into an upper wiring layer is proposed by S. R. Wilson et al., Proceeding of the Seventh International IEEE Multilevel Interconnection Conference, p. 42, 1990.

As a method of forming a via plug inside a via hole, a method of depositing a metal film serving as a barrier metal such as TiW inside the via hole and on an insulating interlayer, depositing a W (tungsten) film on the entire surface, and then, removing the W film from the insulating film is proposed by C. A. Bollinger et al., Proceeding of the Seventh International IEEE Multilevel Interconnection Conference, p. 21, 1990.

An interface between heterogeneous metals in the above-described via structure causes a deterioration in electrical characteristics in the via structure. For example, it is reported by S. R. Wilson et al., Proceeding of the Seventh International IEEE Multilevel Interconnection Conference, p. 42, 1990 that the via contact resistance in a via structure having a heterogeneous metal interface becomes higher than that in a via structure formed by contact of Al alloys.

In addition, it is reported by T. Kwok et al., Proceeding of the Seventh International IEEE Multilevel Interconnection Conference, p. 106, 1990 that, since the heterogeneous metal interface in the via structure causes discontinuity of the carrier movement in the wiring layer when a current flows, reliability against electromigration is greatly degraded as compared to a wiring layer on a flat substrate.

In Japanese Patent Laid-Open No. 63-260051, a method of forming a via plug consisting of Al which is selectively formable on the inner surface (side wall) of a via hole formed in an insulating interlayer on an Si substrate to form a via plug not only on the bottom portion but also on the side wall and bury the via hole.

A method of forming this via structure is shown in FIGS. 1 to 5.

As shown in FIG. 1, a lower wiring layer 300 and an insulating interlayer 40 are formed on an underlying insulating layer 20 formed on the surface of a substrate 10, and a via hole 50 is formed in the insulating interlayer 40.

As shown in FIG. 2, W silicide is then deposited to form a W silicide film 53a having a thickness of 50 nm on the entire surface of the insulating interlayer 40 by the CVD method.

As shown in FIG. 3, the W silicide film 53a on the upper surface of the insulating interlayer 40 and the bottom portion of the via hole 50 is etched by the reactive ion etching method (to be referred to as RIE hereinafter) to form the W silicide film 53a left only on the side wall of the via hole 50, thereby obtaining a via film 53b.

As shown in FIG. 4, Al is deposited and buried only in the via hole 50 by the selective CVD method to form a via plug 52. At this time, Al is deposited not only on the surface of the lower wiring layer 300 consisting of an Al alloy on the bottom surface of the via hole 50 but also on the surface of the via film 53a formed on the side wall of the via hole 50.

Finally, as shown in FIG. 5, the Al alloy is deposited by the sputtering method to form an Al alloy film having a thickness of 400 to 1,000 nm. The Al alloy film is formed into a predetermined pattern to form an upper wiring layer 60, thereby completing a semiconductor device having the via structure.

However, W silicide easily reacts with Al by annealing performed after formation of the via structure, so that a reacted layer is formed on the side wall of the via hole 50. Since the resistivity of the reacted layer is much higher than that of Al, the resistance of the via plug 52 is increased. In addition, the reaction between W silicide and Al may cause a change in volume to add a mechanical stress or form a cavity inside the via hole 50. These phenomena degrade the electrical characteristics of the via structure.

SUMMARY OF THE INVENTION

The present invention has been made to solve the above problems, and has as its object to provide a method of forming a multilayered wiring structure including a via hole in a semiconductor device, and a semiconductor device having a characteristic multilayered wiring structure formed by this method.

As a typical constitution, a method of forming a multilayered wiring structure in a semiconductor according to the present invention is characterized by comprising a first step of forming a lower wiring layer on an upper surface of a substrate, a second step of forming an insulating interlayer on the lower wiring layer, a third step of forming a via hole in the insulating interlayer, a fourth step of forming a thin film (via film) on at least part of a side wall of the via hole formed in the insulating interlayer, the thin film including one of a high melting point metal and a high melting point metal compound selected from the group of including a nitride, a oxynitride, a boride, and a boronitride of the high melting point metal, a fifth step of burying a conductive material including one of Al and an Al alloy in the via hole having the thin film formed on at least part of the side wall to form a via plug, and a sixth step of forming an upper wiring layer on an upper surface of the insulating interlayer.

One of the characteristic steps of the present invention is the fourth step. In the fourth step, since the thin film formed on at least part of the side wall of the via hole contains a high melting point metal or a high melting point metal compound, no reacted layer is formed between the via plug and the thin film by annealing after formation of the via plug.

In addition, when a high melting point metal or a high melting point metal compound is used as a material for the thin film, the thin film can be formed at a relative low temperature, and etching can be performed at an etching rate equal to or higher than that of Al or an Al alloy. Formation of a very rigid oxide film such as an alumina film can be prevented.

Furthermore, the fifth step is characterized by supplying a gas containing an organoaluminum compound, and selectively depositing a conductive material including Al or an Al alloy, by a chemical reaction, inside the via hole in which the thin film is formed, thereby forming the via plug.

In particular, in the fifth step, plasma etching using a chlorine-based gas such as $BCl_3$ is performed. The present inventors confirmed that burying performance of the via plug was improved when plasma etching was performed as a pretreatment.

Other than the above-described constitution of the method of forming a multilayered wiring structure in a semiconductor device, various modifications can be made. As a result, by this method, many semiconductor devices having characteristic multilayered wiring structures can be obtained.

As a typical structure, there is provided a semiconductor device having a multilayered wiring structure, characterized by comprising a lower wiring layer formed on an upper surface of a substrate, an insulating interlayer formed on the lower wiring layer, a via hole formed in the insulating interlayer, in which a via plug is to be buried, a thin film (via film) formed on at least part of a side wall of the via hole, the thin film including one of a high melting point metal and a high melting point metal compound selected from the group consisting of a nitride, a oxynitride, a boride, and a boronitride of the high melting point metal, an upper wiring layer formed on an upper surface of the insulating interlayer, and a via plug, making of a conductive material including one of Al and an Al alloy, for connecting the upper wiring layer with the lower wiring layer.

In addition, there is provided an example in which the lower wiring layer in the semiconductor device has a stacked wiring structure comprises a layer making of a high melting point metal or a high melting point metal compound.

Furthermore, there is provided an example in which a diffusion layer is formed as the lower wiring layer on the surface of the substrate, and a thin film making of a high melting point metal or a high melting point metal compound is formed on the side wall and the bottom portion of the via hole. Here the high melting point metal means a metal such as Ti, Zr, Hf, W, Ta, Mo, V, Nb, et al.; melting points of these metals are respectively as high as about 1500° C. or more (for example, the melting point of Si is 1412° C.).

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIG. 17 is a table showing evaluation results of materials used as thin film materials formed on the side walls of via holes;

DESCRIPTION OF THE PREFERRED EMBODIMENTS

Figure 1:
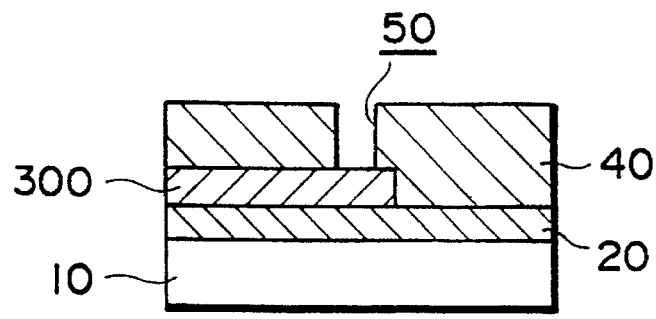
FIGS. 1 to 5 are views for explaining steps in forming a multilayered wiring structure in a conventional semiconductor device.
Figure 2:
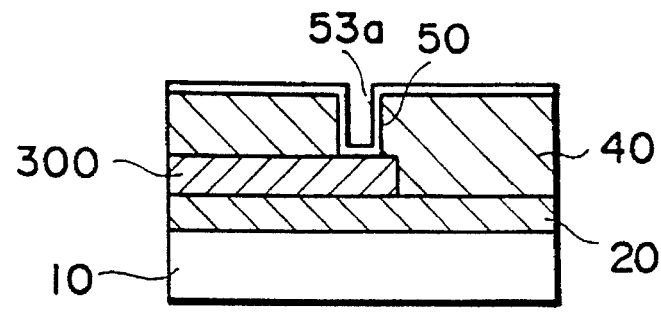
Figure 3:
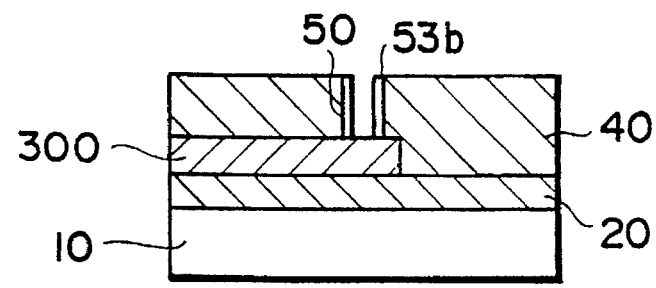
Figure 4:
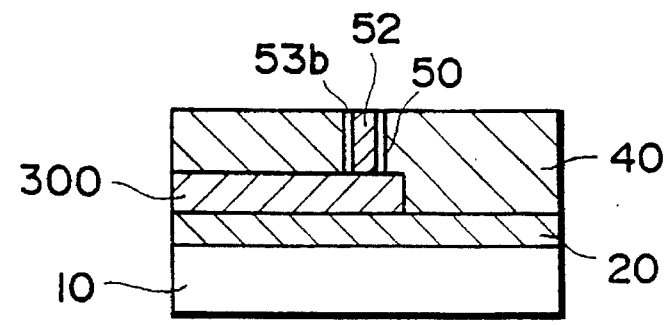
Figure 5:
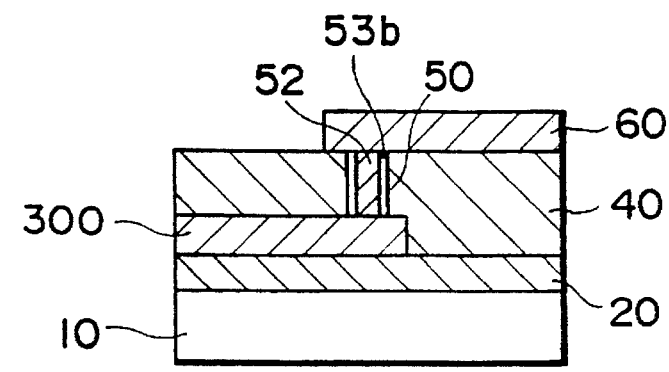

The embodiments of the present invention will be described below with reference to FIGS. 6 to 34. The same reference numerals denote the same parts throughout the drawings, and a detailed description thereof will be omitted.

Figure 6:
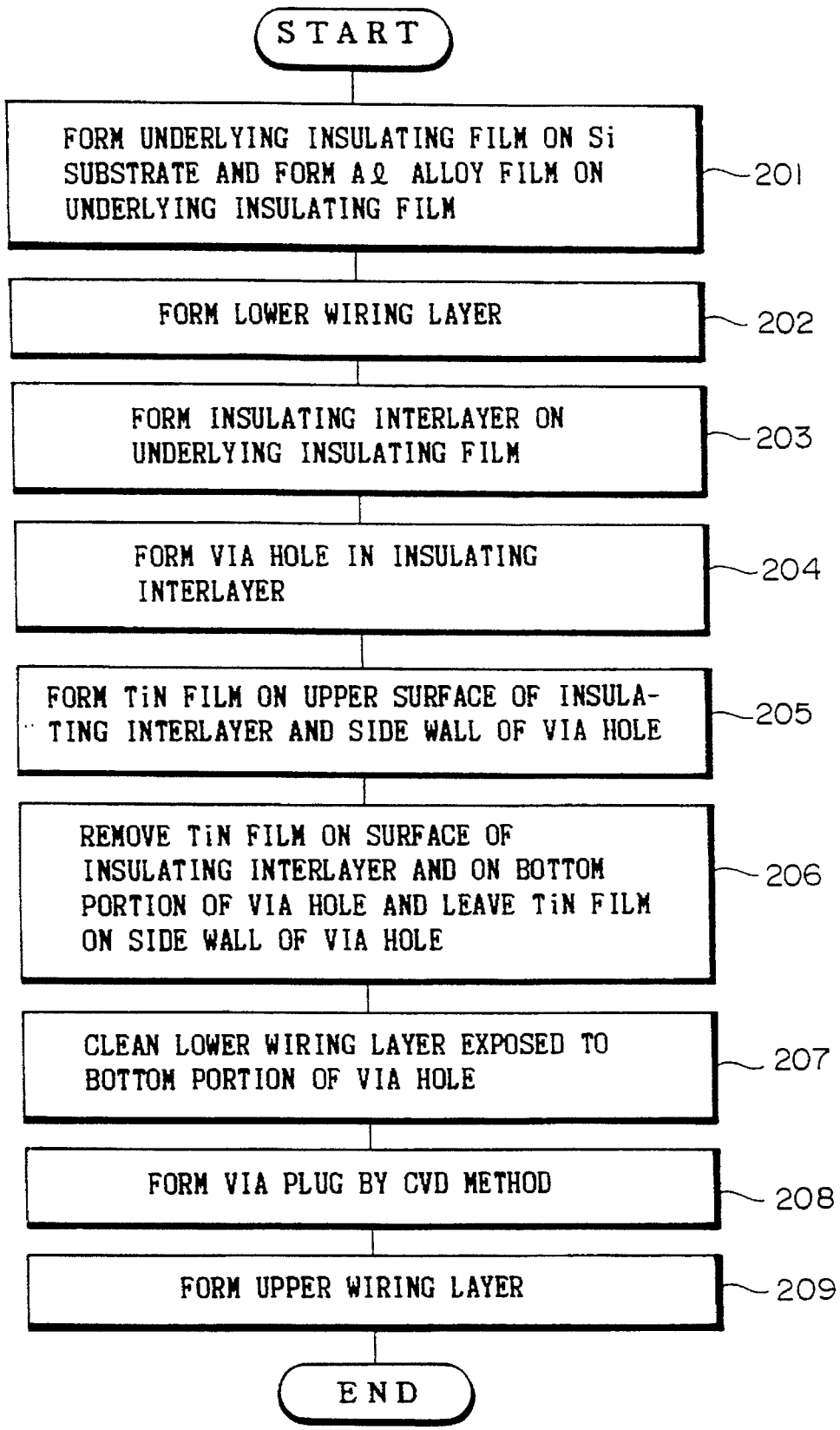
FIG. 6 is a flow chart for explaining the first embodiment of the present invention.

The first embodiment of the present invention will be described with reference to a flow chart in FIG. 6 and views of manufacturing steps in FIGS. 7 to 14. The embodiment to be explained here is the best mode.

Figure 7:
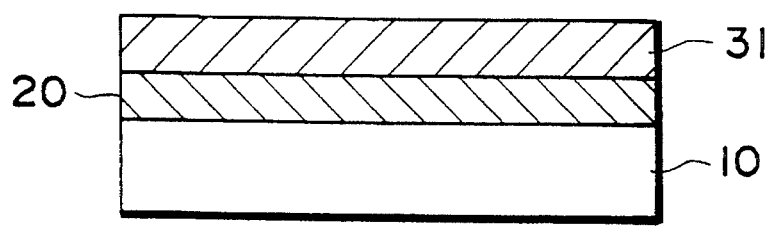
FIGS. 7 to 14 are views for explaining steps in the first embodiment of the present invention.

As shown in FIG. 7, an underlying insulating film 20 is formed on the surface of an Si substrate 10. An Al alloy is deposited on the underlying insulating film 20 by the sputtering method to form an Al alloy film 31 having a thickness of 300 to 800 nm (step 201).

When step 201 is finished, a structure needed for a semiconductor device, e.g., a diffusion layer and a gate electrode, is formed on the surface of the substrate 10.

The Al alloy film 31 is formed into a predetermined wiring pattern to form a lower wiring layer 30 (step 202).

The wiring pattern is formed by the RIE using a chlorine-based gas after a resist pattern is formed by using an exposure apparatus.

Figure 8:
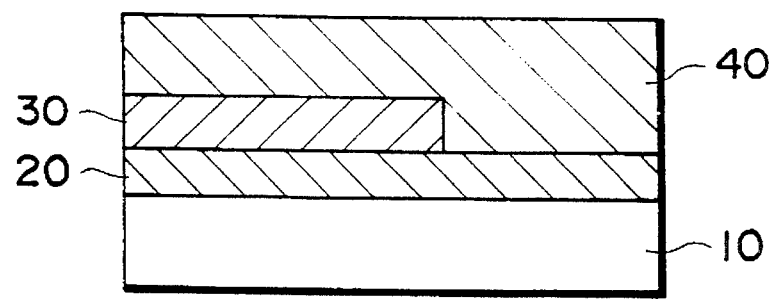

As shown in FIG. 8, an insulating interlayer 40 is formed on the underlying insulting layer 20 on which the lower wiring layer 30 is formed (step 203).

$SiO_2$ is deposited by the plasma CVD method to form an $SiO_2$ film having a thickness of 300 nm, SOG is coated to form an SOG film having a thickness of 300 nm on the flat portion, and annealing is performed at 400° C. Thereafter, $SiO_2$ is deposited by the plasma CVD method again to form an $SiO_2$ film having a thickness of 200 nm, thereby completing the insulating interlayer 40. To form the insulating interlayer 40 in an LSI having a wiring size as small as 0.6 μm or less, the following method is used. $SiO_2$ is deposited by the plasma CVD method using tetraethoxysilane (to be referred to as TEOS hereinafter) and oxygen to form an $SiO_2$ film having a thickness of 100 nm. Further, $SiO_2$ is deposited on the $SiO_2$ film by the atmospheric pressure CVD method using TEOS and ozone to form an $SiO_2$ film having a thickness of 1.0 μm. After SOG is coated to form an SOG film having thickness of 1.0 μm on the $SiO_2$ film and annealing is performed at 400° C., etchback is performed to obtain a 400 nm-thick $SiO_2$ film on the flat portion. $SiO_2$ is deposited again to a thickness of 400 nm by the plasma CVD method.

Figure 9:
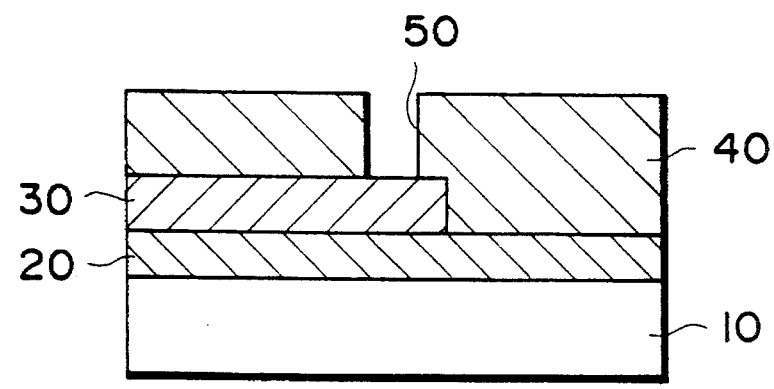

A photomask is set on the insulating interlayer 40, and a resist pattern is formed by using the exposure apparatus. Thereafter, a via hole 50 is formed in the insulating interlayer 40 by the RIE using a fluorine-based gas, as shown in FIG. 9 (step 204).

To increase the wiring density, it is preferable that the side wall of the via hole 50 is substantially perpendicular to the surface of the Si substrate 10. On the other hand, to minimize the possibility of generation of a cavity during formation of a via plug 52, it is preferable that the side wall of the via hole 50 has a tapered shape. Taking the two conditions into consideration, the spread angle of the inner wall preferably falls within the range of 80° to 87° with respect to the surface of the Si substrate 10.

Figure 10:
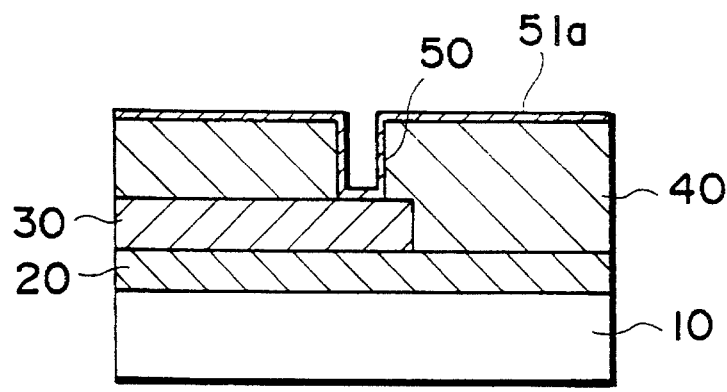

Reactive sputtering is performed in an atmosphere containing nitrogen by using a Ti target to form a TiN film 51a having a thickness of 10 to 50 nm on the upper surface of the insulating interlayer 40, as shown in FIG. 10 (step 205). At this time, the deposition temperature during formation of the TiN film 51a is preferably about 300° C. This is because, when the deposition temperature (surface temperature of the substrate) is about 300° C., the lower wiring layer 30 is not adversely affected, and high film quality can be obtained.

At this time, as the thickness of the TiN film 51a (via film) on the side wall of the via hole 50 is increased, the diameter of the portion where the via plug 52 is buried is decreased to cause an increase in contact resistance. For this reason, the thickness of the TiN film 51a is preferably as thin as possible, for example, 50 nm or less in a fine via hole 50 (having a diameter of 0.6 μm or less). When a collimator plate is inserted between the Ti target and the upper surface of the insulating interlayer 40 to limit the angle of particles landing on the upper surface of the insulating interlayer 40, coverage on the side wall of the fine via hole 50 is prevented from being degraded, so that the deposit can be further thinner.

Although, in this embodiment, TiN is used as the via film (51b) formed on the side wall of the via hole 50, TiON may also be used. It is confirmed by the present inventors that a group IVa metal, especially Ti can be effectively used, though Ti easily reacts with Al. More specifically, when Ti is formed thinner as compared to the diameter of the via hole 50 (for example, when a film having a thickness of 50 nm or less is formed while the diameter of the via hole 50 is 0.5 μm), an uniform alloy layer ($Al_3Ti$) is formed, while an increase in contact resistance caused due to formation of a nonuniform reacted layer on the side wall of the via hole 50 can be prevented. The via plug 52 shown in FIG. 13 can be equally or more effectively formed (by the Al-CVD method) as compared to use of TiN. Other high melting point metals (for example, W, Ta, Mo et al.) can be used without reacting with the via plug 52, in condition that the annealing temperature after formation of the via plug 52 is limited at less than 400° C. The via film 51b may be a stacked wiring structure constituted by forming a high melting point metal compound on a high melting point metal film. For example, TiN or TiON is formed on a Ti film.

When TiN is left also on the bottom portion of the via hole 50, it is necessary to use this stacked structure to reduce the contact resistance between the via film and the lower wiring layer 30. It is also necessary to remove an alumina film formed on the surface of the lower wiring layer 30, i.e., the Al alloy film on the bottom portion of the via hole 50 by Ar sputter etching before step 205.

The TiN film 51a (via film) can also be formed by the CVD method. More specifically, it is known to use $TiCl_4$ and methylhydrazine, or the ECR-CVD method.

Figure 11:
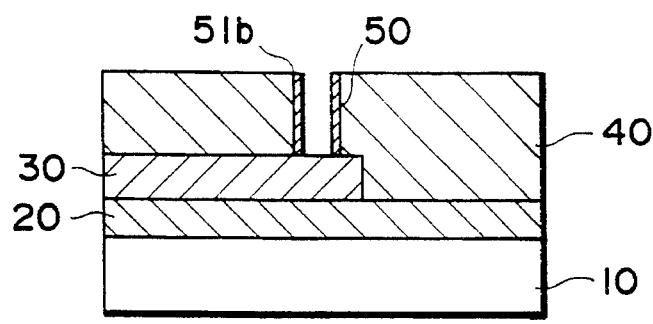

The TiN film 51a on the surface of the insulating interlayer 40 and on the bottom portion of the via hole 50 is removed by plasma etching using a gas atmosphere containing fluorine and chlorine. As shown in FIG. 11, the TiN film 51a is left only on the side wall of the via hole 50 (it may be part thereof) to form the via film 51b (step 206).

In more detail, an ECR etching apparatus using a radio-frequency bias is used to remove the TiN film 51a under the conditions that the $BCl_3$ flow rate was 50 sccm, the $SF_6$ flow rate was 30 sccm, the total pressure was 8 mtorr, the microwave current was 300 mA, and the radio-frequency power was 50 W. Under these conditions, removal of 30-nm TiN film 51a takes 20 seconds. Under these removal conditions, the selectivity ratio between TiN and Al is more than 20:1. Etching can be performed under the same conditions when Ti is used as a material of the via film 51b.

At this time, the etching rate of the lower wiring layer 30, i.e., the Al alloy layer is very low as compared to that of the via film 51b consisting of TiN, so that a high selectivity ratio can be obtained to prevent the Al alloy film on the bottom portion of the via hole 50 from being overetched.

Figure 12:
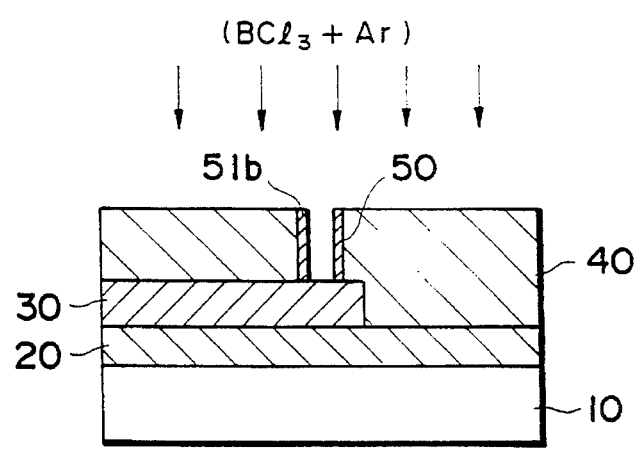

The lower wiring layer 30 (Al alloy film) exposed to the bottom portion of the via hole 50, as shown in FIG. 12, is cleaned by plasma etching using a chlorine-based gas ($BCl_3$+Ar).

Etching was performed under the conditions that the $BCl_3$ flow rate was 80 sccm, the Ar flow rate was 18 sccm, and the total pressure was 0.1 torr, by using a parallel plate type etching apparatus for ten minutes.

A deposit or alumina film is adhered to the surface of the lower wiring layer 30 exposed to the bottom portion of the via hole 50 when plasma etching is performed on the TiN film 51*a* or the surface of the lower wiring layer is exposed to air after plasma etching. The deposit and the alumina film must be removed because they interfere with Al deposition by the CVD method. On the other hand, the surface of the via film 51*b*, i.e., the TiN film on the side wall of the via hole 50, contains a large amount of oxygen absorbed during the air exposure. However, its influence is much smaller than that of the deposit or the alumina film on the surface of the lower wiring layer 30. In addition, cleaning of the surface of the lower wiring layer 30 facilitates deposition. For this reason, no special treatment must be performed on the surface of the via film 51*b*.

Figure 13:
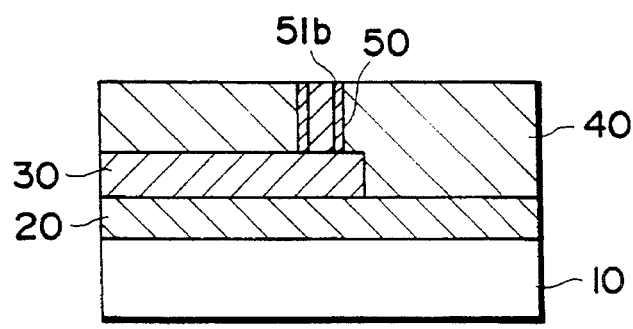

Al is selectively deposited only inside the via hole 50 by the CVD method using, e.g., DMAH and hydrogen as materials to form the via plug 52, as shown in FIG. 13 (step 208).

The Al-CVD method was performed under the conditions that the partial pressure of DMAH (dimethylaluminuhydride) was 30 mtorr, the total pressure was 2 torr, and the surface temperature of the substrate 10 was 210° C. Under these conditions, the deposition time was 90 seconds when the diameter of the via hole 50 was 0.5 μm.

Other than DMAH, an intermolecular compound between DMAH and trimethylaluminum, and another organoaluminum compound such as tri-isobutylaluminum, trimethylamine allan, dimethylethylamine allan, trimethylaluminum, or triethylaluminum can also be used as a material for the CVD method. At this time, the Al deposition is performed not only on the surface of the lower wiring layer 30 (Al alloy film) exposed to the bottom portion of the via hole 50 but also on the surface of the via film 51*b*. Therefore, ideally, it is possible to bury Al within a period of time to obtain a thickness half of the diameter of the via hole 50.

Assume that Al (via plug 52) is most ideally deposited. When the via hole 50 having a diameter of 0.6 μm is buried at a deposition rate of 200 nm/min, the deposition time is 90 seconds. When the via hole 50 having a diameter of 0.4 μm is buried at the same deposition rate, the deposition time is 60 seconds. Practically, the diameter of the via hole 50 or the deposition rate varies. Taking this into consideration, the deposition time increases by about 20%. However, it is apparent that the deposition time can be greatly shortened as compared to Al deposition only on the bottom surface of the via hole 50. By shortening the deposition time, productivity needed for mass-production can be obtained. Further, the selectivity of the Al alloy can be maintained, and generation of Al grains caused due to the non-selective deposition can be easily prevented.

When the aspect ratio of the via hole 50 (ratio of the depth to the diameter of the via hole 50) is ½ or more, the deposition time needed for burying is determined in accordance with the diameter of the via hole 50, and does not depend on the depth. For this reason, ideally, when all via holes 50 have a predetermined diameter, all via holes 50 can be completely buried even if the depths of the via holes 50 are different from each other.

Figure 16:
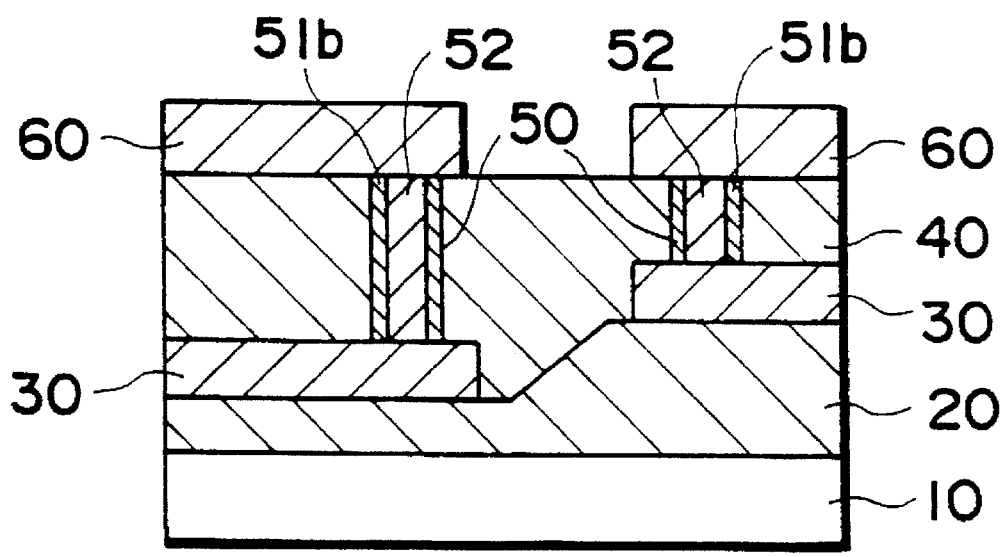
FIG. 16 is a view for explaining the effect of the present invention, in which the illustrated semiconductor device is obtained by the first embodiment of the present invention.

FIG. 16 shows a sectional view of a semiconductor device showing this state.

Practically, it is difficult to form the via holes 50 all having the exactly same diameter because of a variety of reasons. Therefore, when the diameter of the via hole 50 is designed, two types of via holes, i.e., one having a minimum diameter and the other having a larger diameter, are prepared. The deposition time is set in accordance with the via hole having a larger diameter. In the via hole having a small diameter, Al is excessively deposited to form projections. However, the present inventors confirmed by an experiment that, when the diameter was as large as 0.4 μm for the former, and 0.6 μm for the latter, the projection was as high as 0.1 μm, i.e., half of the difference between the two diameters, and it did not adversely affect on the characteristics. Other than the two types of via holes, a via hole having a much larger diameter (e.g., 1.5 μm or more), which can reliably obtain good electrical characteristics without forming a via plug, may be present. In addition, when the surface temperature of the substrate 10 is increased (300° C. or more, preferably 400° to 470° C.) during deposition of the Al alloy film serving as an upper wiring layer to improve the flow property of Al, the Al alloy film can be flattened. In this case, after the via plug 52 is formed, the Al alloy film is deposited before the surface of the via plug 52 is exposed to air, or the Ti film (having a thickness of 10 to 50 nm) is deposited before the Al alloy film is deposited, thereby obtaining the Al alloy film having satisfactory flatness. If the temperature used in the Al-sputtering method is more than 350° C., an unified $Al_3Ti$ film is formed by reacting Ti with Al. In this case, the via contact resistance is not increased.

Figure 14:
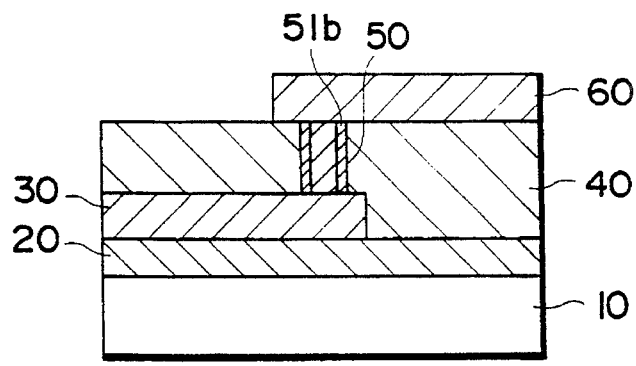

Al is deposited by the sputtering method to form the Al alloy film having a thickness of 400 to 1,000 nm. By using the same method as in formation of the lower wiring layer 30, as shown in FIG. 14, an upper wiring layer 60 is formed, thereby completing a semiconductor device having a multilayered wiring structure (step 209).

When the upper wiring layer 60 is to be formed, if an Al alloy film is deposited by using an apparatus other than that used for formation of the via plug 52 when the upper wiring layer 60 is formed, the alumina film formed on the upper surface of the via plug 52 must be removed by sputter etching using Ar ions or the like just before deposition to obtain good electrical contact.

After the via plug 52 is formed, if the Al alloy film is deposited to form the upper wiring layer 60 without unloading the resultant structure to the outer atmosphere, better electrical contact can be obtained because no alumina film is formed on the upper surface of the via plug 52 at all.

Until the semiconductor device using the via structure of the present invention is completed, a surface protective film is formed after formation of the via plug 52, and annealing is performed to remove process damage. Annealing is performed at a temperature of about 400° to 450° C. Since the reaction between the TiN film 51*b* and the via plug 52 does not notably progress until about 500° C., no reacted layer is formed at the interface between the TiN film 51*b* and the via plug 52. Therefore, the electrical characteristics in this via structure are not degraded.

Figure 15:
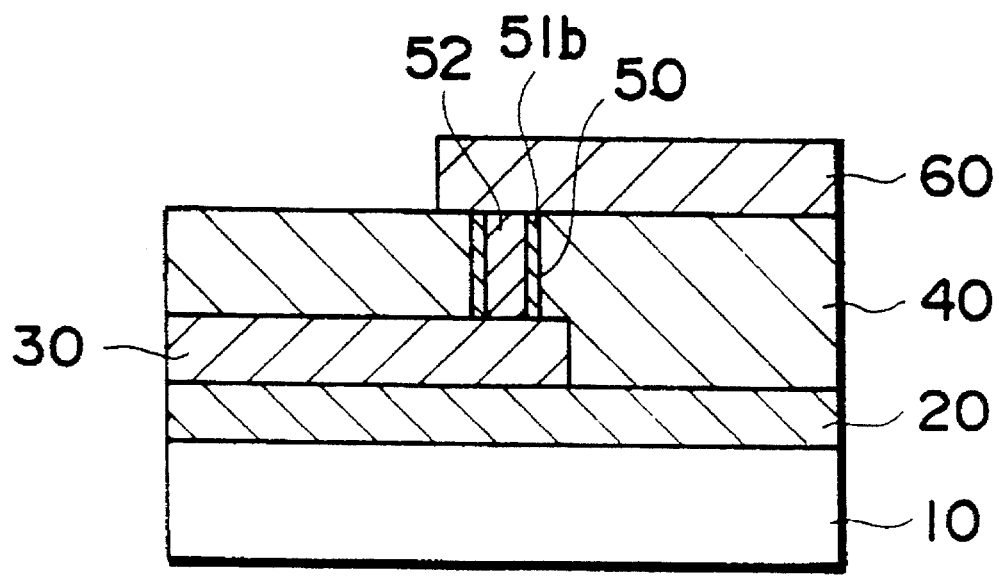
FIG. 15 is a sectional view of a semiconductor device obtained by the first embodiment of the present invention.

The semiconductor device obtained by the above-described first embodiment is shown in FIG. 15.

In this semiconductor device, the underlying insulating film 20 is formed on the Si substrate 10, and the lower wiring layer 30 constituted by the Al alloy film 31 is formed on the underlying insulating film 20. The insulating interlayer 40 is formed on the underlying insulating film 20 on which the lower wiring layer 30 is formed. The via hole 50 is formed in the insulating interlayer 40, and the via film 51*b* consisting of TiN is formed on the side wall of the via hole 50. The via plug 52 including of Al is formed inside the via film 51*b*. The upper wiring layer 60 and the lower wiring layer 30 are electrically connected by the via plug 52. The upper wiring layer 60 is constituted by the Al alloy film, like the lower wiring layer 30. The Al alloy used for the upper wiring layer 60 may have the same components as those used for the lower wiring layer 30, or it may have different components.

Therefore, there is no heterogeneous metal interface in the via structure of this semiconductor device, and the electrical characteristics of the via structure are not degraded.

A structure needed for a semiconductor device, such as a diffusion layer and a gate electrode, is formed inside the Si substrate and on the surface thereof. A contact hole is formed at the required position of the underlying insulating layer 20, and a contact structure is formed to connect the lower wiring layer 30 with the diffusion layer, the gate electrode, or any other structure.

One or more insulating interlayers 40 and metal wirings may respectively be stacked on the upper wiring layer 60.

The material used for the via film 51b needs to have the following characteristics.

(a) The material can form a via film at a low temperature (400° C. or less) so as not to degrade the lower wiring layer 30.
(b) The material can be etched at a rate equal to or higher than that of the Al alloy film, and the material causes no overetching in the lower wiring layer 30 when the film on the bottom portion of the via hole 50 is removed.
(c) The material produces no rigid oxide film for inhibiting selective deposition of Al by the CVD method, or even if the oxide film is formed, the oxide film can be easily removed by plasma etching or the like.
(d) The material does not react with the via plug by annealing (at a temperature of about 400° C.) after formation of the via plug 52, or form an unified reaction film in the case of the reaction between the material and the via plug.

In FIG. 17, the characteristics (a), (b), (c), and (d) are briefly referred to as low temperature formation, etching, film formation inhibition, and reaction, respectively.

As shown in FIG. 17, it was apparent by experiments that the nitride, oxynitride, boride, and boronitride of a high melting point metal such as titanium (Ti), zirconium (Zr), hafnium (Hf), tungsten (W), tantalum (Ta), molybdenum (Mo), vanadium (V), and niobium (Nb), or mixtures mainly including these materials were suitable. In more detail, of these compounds, TiN, TiB, TiBN, WN, and ZrN formed by the reactive sputtering method were suitable. On the other hand, coverage inside the fine via hole 50 was not a primary concern. For example, when the TiN film formed by the reactive sputtering method to have a covering ratio (ratio of the film thickness on the side wall of the via hole 50 to that on of the surface of the insulating interlayer 40) of only 10% or less near the bottom portion of the via hole 50 having a depth of 1 μm and a diameter of 0.6 μm was used, and the thickness of the TiN film on the surface of the insulating interlayer 40 was as small as 20 nm, a via structure having a good shape and characteristics was obtained. Of cource, by a method having a excellent coverage, such as collimated sputtering, CVD et al., the thin film on the surface of the insulating interlayer can be further preferably controlled as to the thickness thereof. A high melting point metal has secondary excellence as to a high melting point metal compound. Concretely, a group IVa metal such as Ti et al. can be used in the condition of the thin film, because of the formation of an unified film. A metal such as W, Ta, Mo et al, can be used without reacting in the limited condition of 400° C. or less (annealing temperature).

Figure 18:
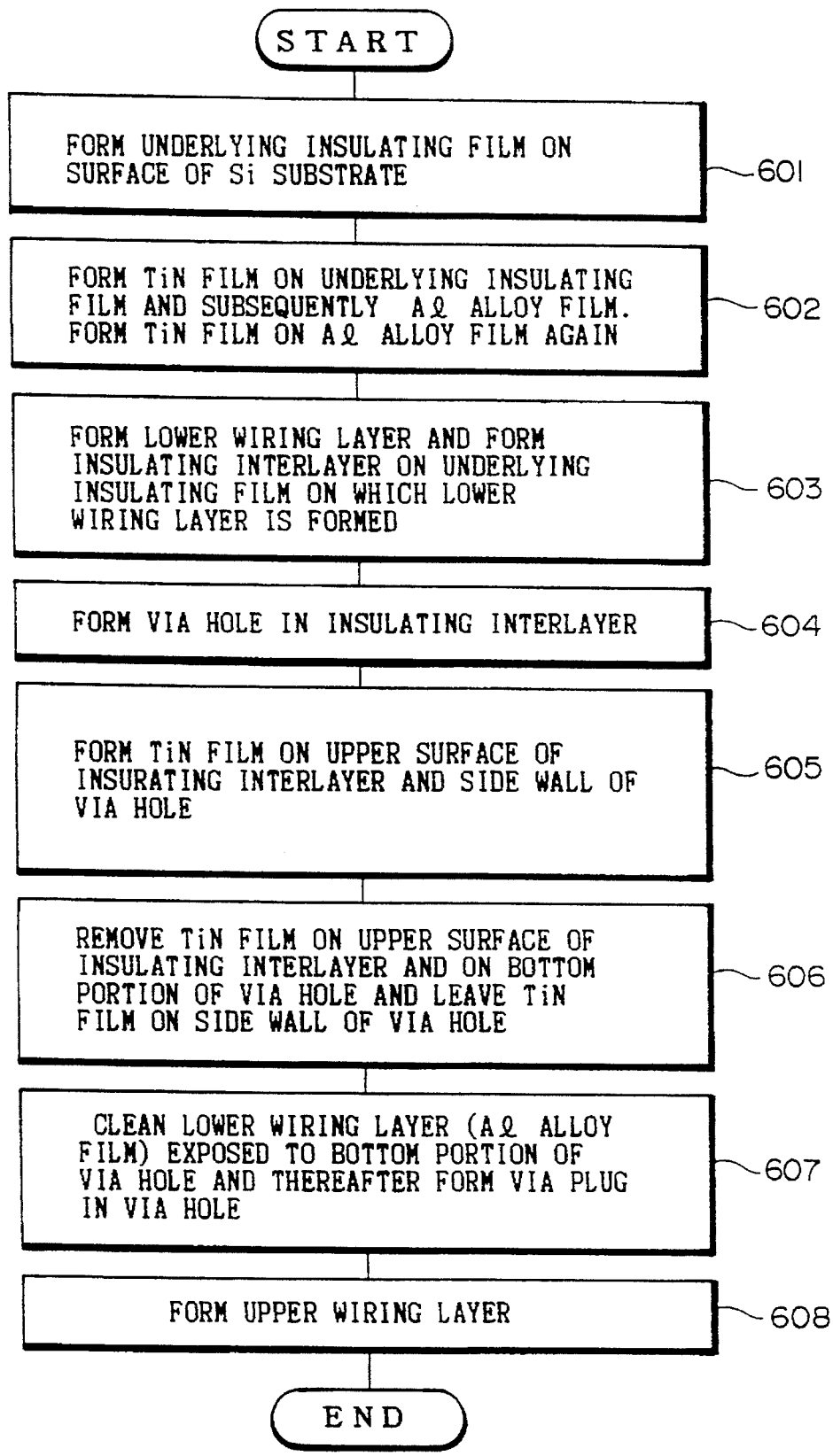
FIG. 18 is a flow chart for explaining the second embodiment of the present invention.

The second embodiment of the present invention will be described with reference to the flow chart in FIG. 18 and views of manufacturing steps in FIGS. 19 to 24.

Unless otherwise specified, the manufacturing conditions, selection of materials, and the like are the same as in the above-described first embodiment.

An underlying insulating film 20 is formed on the surface of an Si substrate 10, as in the first embodiment (step 601).

Figure 19:
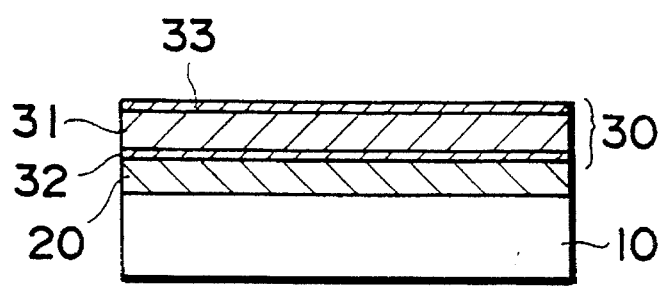
FIGS. 19 to 24 are views for explaining steps in the second embodiment of the present invention.

As shown in FIG. 19, TiN is deposited on the underlying insulating layer 20 by the reactive sputtering method to form a TiN film 32 having a thickness of 20 to 150 nm, and Al is deposited on the TiN film by the sputtering method to form an Al alloy film 31 having a thickness of 300 to 800 nm. TiN is deposited again on the Al alloy film 31 by the reactive sputtering method to form a TiN film 33 having a thickness of 10 to 50 nm (step 602).

The stacked metal film constituted by the Al alloy film 31 and the TiN films 32 and 33 is formed into the predetermined pattern by using the same method as in the first embodiment to form a lower wiring layer 30. An insulating interlayer 40 is formed on the underlying insulating film 20 on which the lower wiring layer 30 is formed by using the same method as in the first embodiment (step 603).

Figure 20:
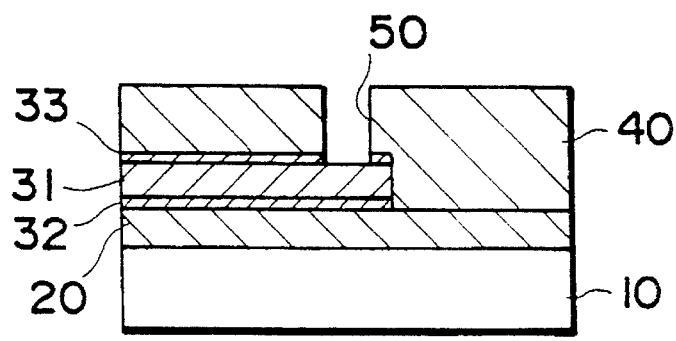

As shown in FIG. 20, a via hole 50 is formed in the insulating interlayer 40 as in the first embodiment (step 604). When the insulating interlayer 40 in the region where the via hole 50 is to be formed is removed by the RIE using a fluorine-based gas, the TiN film 33 on the bottom portion of the via hole 50 is also removed to expose the surface of the Al alloy film 31.

As in the first embodiment, reactive sputtering is performed in the atmosphere containing nitrogen by using a Ti target, thereby forming a TiN film 51a having a thickness of 10 to 50 nm on the upper surface of the insulating interlayer 40 (step 605).

Figure 21:
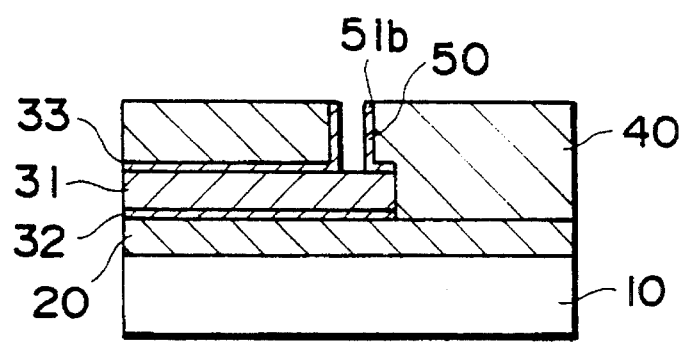

By using the same method as in the first embodiment, the TiN film on the surface of the insulating interlayer 40 and on the bottom portion of the via hole 50 is removed. The TiN film is left only on the side wall of the via hole 50 to form a via film 51b, as shown in FIG. 21 (step 606).

Figure 22:
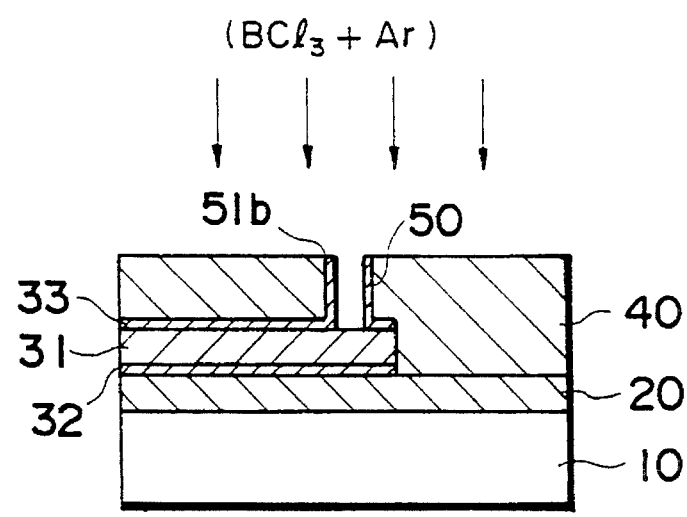
Figure 23:
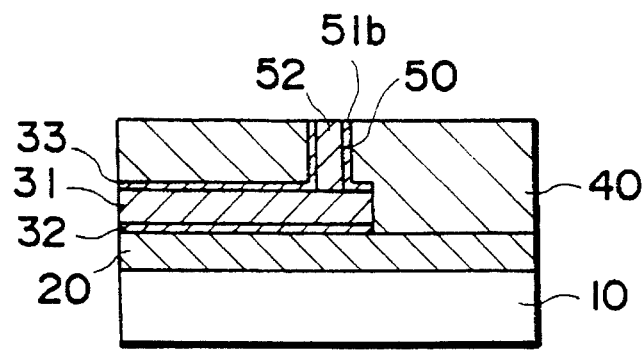

As shown in FIG. 22, by plasma etching using a chlorine-based gas (BCl$_3$+Ar), cleaning is performed on the lower wiring layer 30 (Al alloy film) exposed to the bottom portion of the via hole 50, as in the first embodiment. Thereafter, as shown in FIG. 23, Al is selectively deposited only inside the via hole 50 by the CVD method using DMAH as a material to form a via plug 52 (step 607). At this time, Al is deposited not only on the lower wiring layer 30 having the Al alloy film exposed to the bottom portion of the via hole 50, but also on the surface of the via film 51b formed on the side wall of the via hole 50.

Figure 24:
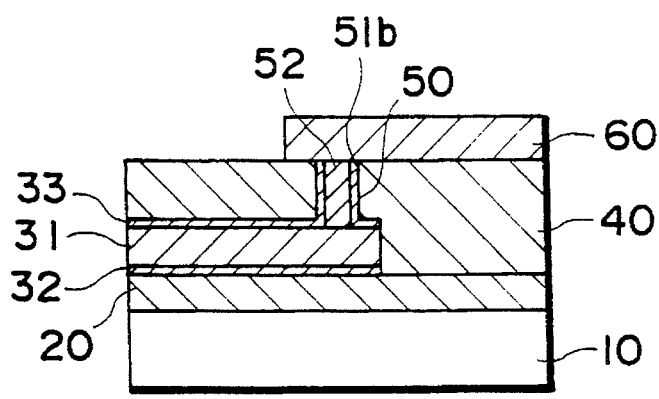
Figure 25:
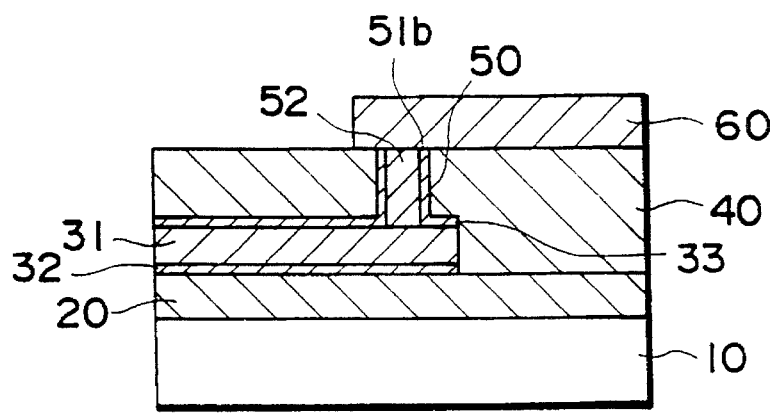
FIG. 25 is a sectional view of a semiconductor device obtained by the second embodiment of the present invention.

Al is deposited on the insulating interlayer 40 by the sputtering method to form an Al alloy film having a thickness of 400 to 1,000 nm. As in the first embodiment, an upper wiring layer 60 is formed to complete a semiconductor device having a multilayered wiring structure, as shown in FIG. 24 (step 608).

The second embodiment has exemplified a method in which the TiN film on the bottom portion of the via hole 50 is removed by the RIE when the via hole 50 is formed. However, there is a method in which the TiN film is removed not by the RIE to form the via hole 50. In this case, by adjusting the etching amount when the TiN film 51a on the surface of the insulating interlayer 40 and on the bottom portion of the via hole 50 is removed, the TiN film 33 on the lower wiring layer 30 is removed at the same time. Thus, when the surface of the Al alloy film 31 inside the lower wiring layer 30 is exposed to air and the plasma atmosphere, the exposure time is shortened. The cleanness of the surface is secured, thereby easily securing good electrical connection characteristics between the Al alloy film 31 and the via plug 52.

The semiconductor device obtained by the above-described second embodiment described above is shown in FIG. 25.

The structure of the semiconductor device of the second embodiment and that of the first embodiment have a difference in structure of the lower wiring layers 30. In the semiconductor device shown in FIG. 15, the lower wiring layer 30 is constituted only by the Al alloy film 31. However, in the semiconductor device shown in FIG. 25, the lower wiring layer 30 is constituted by forming the Al alloy film 31 on the TiN film 32 and further forming the TiN film 33 thereon.

The TiN film 33 is not formed on the surface of the lower wiring layer 30 on the bottom portion of the via hole 50, and the Al alloy film 31 directly contacts the via plug 52.

The TiN films 32 and 33 constituting the lower wiring layer 30 serve as a barrier metal for avoiding occurrence of an undesirable reaction at the contact portion and a reflection preventive film for reducing the reflectance to the exposure light to facilitate accurate formation of a resist pattern, respectively, and at the same time, improve reliability of the lower wiring layer 30. Other than the TiN films 32 and 33, the films formed on the upper and lower surfaces of the Al alloy film 31, constituting the lower wiring layer 30 may include another high melting point metal compound (e.g., TiW, WN, or TiON), or may be a high melting point metal film.

In addition, instead of a single layer film, the films formed on the upper and lower surfaces of the Al alloy film 31 may be a multilayered film constituted by stacking, for example, a Ti film for reducing the contact resistance and a TiN film.

In the semiconductor device obtained by the second embodiment (FIG. 25), a structure in which the lower wiring layer 30 is constituted by stacking the compound films of the same type of high melting point metal on the upper and lower surfaces of the Al alloy film is exemplified. However, as needed, the compound film may be stacked on one of the upper and lower surfaces. Two films including of different materials may be stacked on the upper and lower surfaces of the Al alloy film, respectively. Although not shown in the second embodiment, the upper wiring layer 60 may also have a structure constituted by stacking high melting point metal compound films on the upper and/or lower surfaces of the Al alloy film, like the lower wiring layer 30. There is preferably not the lower layer of the upper wiring layer 60, because heterogeneous metal interface is not formed between the upper wiring layer 60 and the via plug 52. In the above arrangement, even if the width of the upper wiring layer 60 is reduced to, e.g., 1 μm or less, reliability can be guaranteed.

In this embodiment, the films stacked on the upper and lower surfaces of the lower wiring layer 30 use the same material as in the via film 51b formed on the side wall of the via hole 50. However, these films may be formed by using different materials, respectively. Preferably, the etching characteristic of removing the via film on the bottom position of the via hole 50 is equal to that of removing the upper layer 33 of the lower wiring layer 30. For example, each of TiN, TiON, and Ti is a preferable metal compound or metal or compound metal.

The third embodiment of the present invention will be described with reference to FIGS. 26 to 31. Unless otherwise specified, the manufacturing conditions, selection of materials, and the like are the same as in the above-described first and second embodiments.

Figure 26:
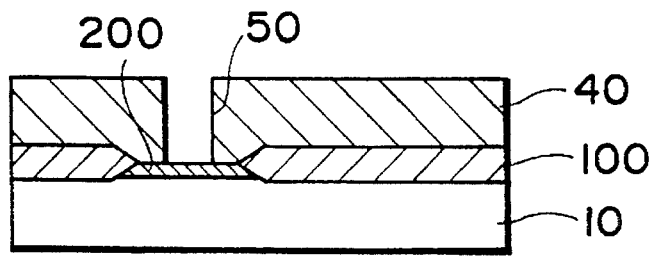
FIGS. 26 to 31 are views for explaining steps in the third embodiment of the present invention.

As shown in FIG. 26, a diffusion layer 200 in which an impurity is diffused is formed on an Si substrate 10. The diffusion layer 200 constitutes a lower wiring layer. The manufacturing steps until a via hole 50 is formed in a lower wiring layer 30 are the same as in the above-described first and second embodiments. An insulating interlayer 40 is formed by CVD method. The reference numeral 100 denotes an isolation insulating film. The lower wiring layer is formed by simply diffusing the impurity, but it may be constituted by forming a metal silicide on the surface of the diffusion layer 200. In this case, as the metal silicide, $TiSi_2$, $NiSi_2$, $CoSi_2$, or NiSi is useful.

Figure 27:
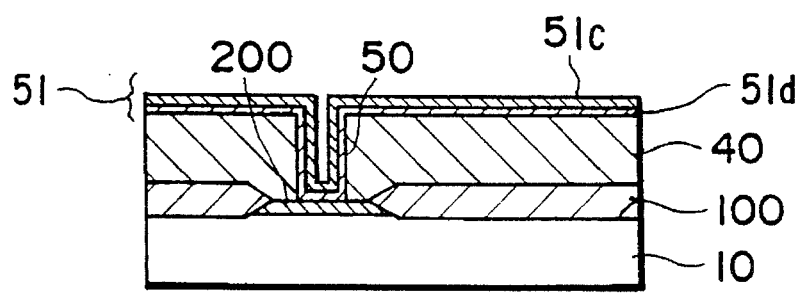

Subsequently, as shown in FIG. 27, a TiN/Ti film is deposited on the entire surface of the substrate 10. In this embodiment, a thin film 51 has a two-layered structure constituted by forming a high melting point metal compound 51c (TiN) on a high melting point metal film 51d (Ti of the group IVa metal). As the high melting point metal compound, TiON may also be useful.

The Ti film is effective to reduce the contact resistance between the diffusion layer 200 and the via plug 52. However, the Ti film is not necessary in the case of forming the metal silicide on the diffusion layer 200.

Figure 28:
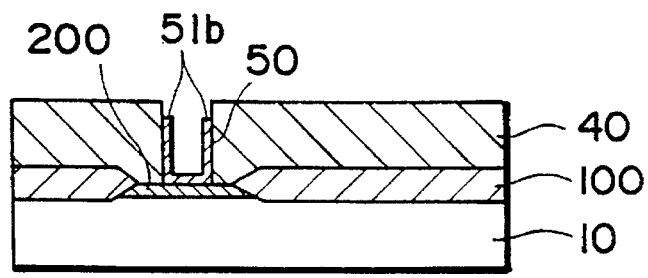
Figure 29:
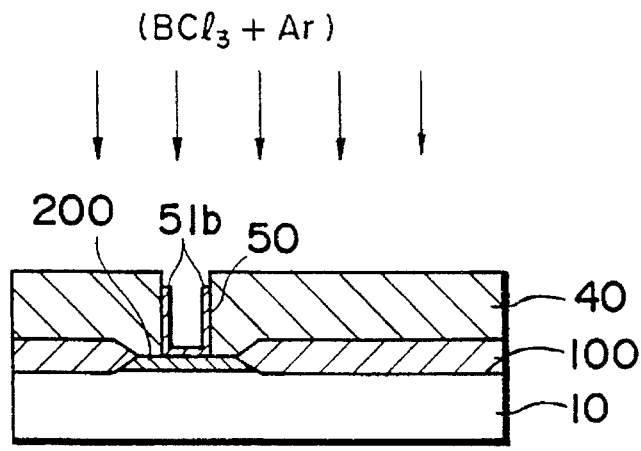

After a resist is coated on the entire surface of the substrate body (the substrate 10, the diffusion layer 200, the isolation insulating film 100, and the underlying interlayer 40 are included), the resist film on the surface of the insulating interlayer 40 is removed by oxygen plasma etching (FIG. 28). At this time, the upper part of resist on the side wall of the via hole 50 is preferably removed (for example, the resist is removed by about ½ of the diameter of the via hole 50). Thereafter, the exposed TiN/Ti film is removed by plasma etching ($BCl_3+SF_6$), and the resist film is removed by $O_2$ plasma etching. In the third embodiment, the thin film 51b, which may also be a multilayered structure (e.g., Ti/TiN) similar to the thin film 51 shown in FIG. 27, is formed not only on the side wall (it may be part thereof) but also on the bottom portion of the via hole 50.

Figure 30:
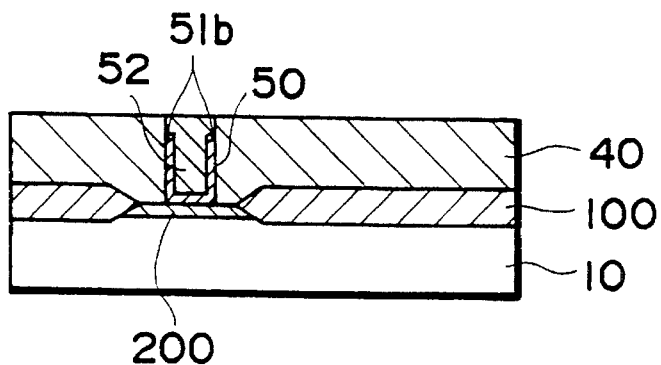
Figure 31:
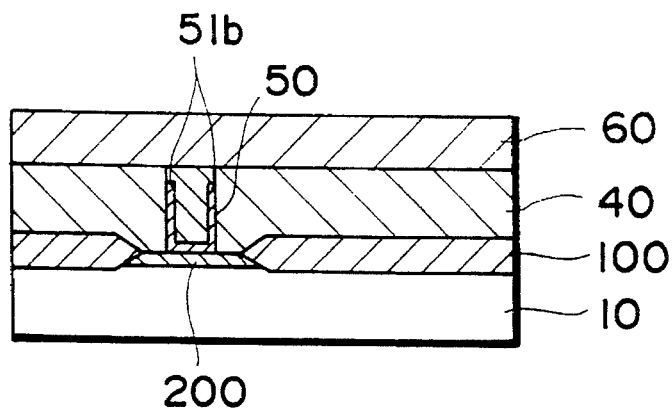

After the inside of the via hole 50 is cleaned by plasma etching using a chlorine-based gas ($BCl_3+Ar$), a via plug 52 is formed by the Al-CVD method, as shown in FIG. 30. Finally, an upper wiring layer (Al or an Al alloy) is deposited so as to contact the upper surface of the via plug 52 in FIG. 31, and patterned into the predetermined shape.

Figure 32:
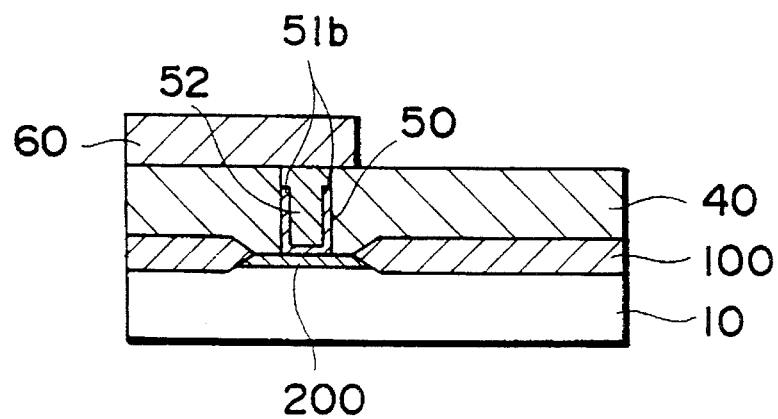
FIG. 32 is a sectional view of a semiconductor device obtained by the third embodiment of the present invention.

The semiconductor device obtained by the above-described third embodiment is shown in FIG. 32.

As described above, according to the first to third embodiments of the present invention, TiN is used as a material for the via film 51b formed on the side wall of the via hole 50. Unlike the W silicide, TiN does not easily react with Al by annealing after formation of the via structure, and selective deposition of Al is not inhibited. Since no reacted layer is formed, no reduction to cause an increase in resistance of the via plug 52 portion occurs. Further, the TiN film prevents the reaction between the diffusion layer and the via plug made of Al or an Al alloy. Therefore, the electrical characteristics of the via structure are not degraded.

In this case, the heterogeneous metal interface between the TiN film and Al of the via plug is created, and the contact resistance thereof increases. However, the characteristic of the plug structure does not worsen because the resistance of the diffucion is larger than the contact resistance. Further, as a large current does not flow in the diffusion layer, electromigration does not create in the plug structure.

Although the surface of the via film 51b including TiN contains a large amount of oxygen, its influence is much smaller than that of the deposit or an alumina film on the surface of the lower wiring layer 30. In addition, cleaning (plasma etching using a chlorine-based gas) of the surface of the lower wiring layer 30 facilitates deposition. For this reason, no special treatment needs to be performed on the surface of the via film 51b on the inner surface (side wall) of the via hole 50.

Figure 33:
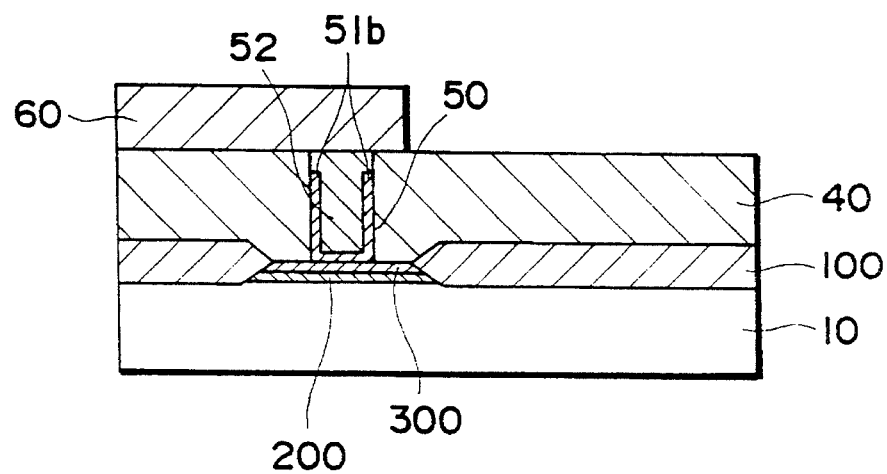
FIG. 33 is a view showing an application of the semiconductor device (FIG. 32) obtained by the third embodiment of the present invention.

As for the above-described lower wiring layer, a plurality of structures are proposed, and the lower wiring layer may have a structure in which a metal silicide film 300 ($TiSi_2$ in this embodiment) is formed on the diffusion layer 200, as shown in FIG. 33.

Figure 34:
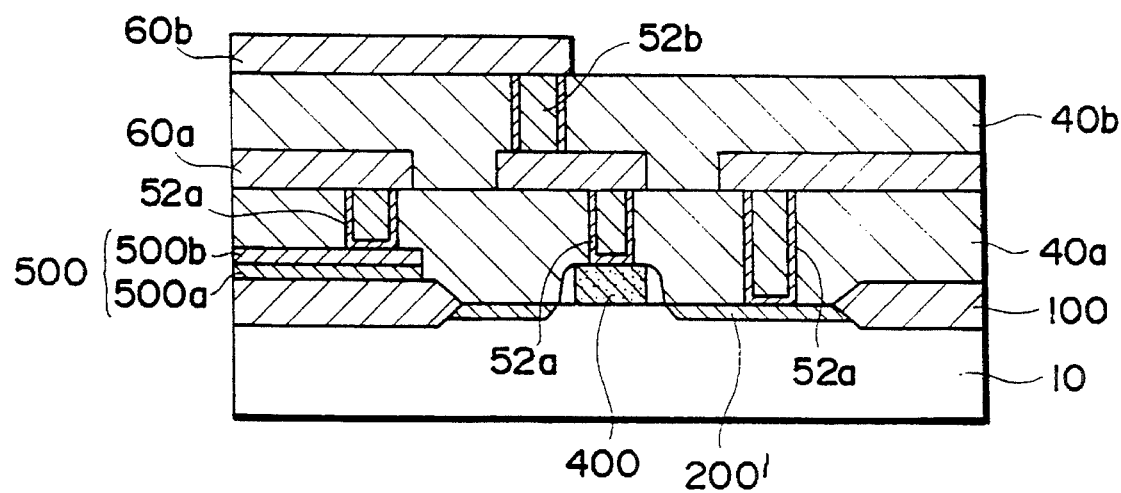
FIG. 34 is a view showing an application of the semiconductor device obtained by the above-described first and third embodiments of the present invention.

As shown in FIG. 34, it is possible to form the lower wiring layer having a plurality of structures on a single substrate, thereby realizing a multilayered wiring structure.

In FIG. 34, a polycide wiring 500 constituted by forming $WSi_x$ 500b on a polysilicon film 500a is formed as the lower wiring layer corresponding to one of the first Al plugs 52 (three are shown in this embodiment) formed on a lower insulating interlayer 40a. Other than this embodiment, the polycide wiring 500 may be constituted by forming, $MoSi_x$ or $TiSi_2$ on the polysilicon film 500a. As an other lower wiring layer, a lower wiring layer is made of silicede only, high melting point metal (W, et al.), or high melting point metal compound (TiN, et al).

As another lower wiring layer, a gate 400 consisting of polysilicon may be formed in correspondence with another first Al plug 52a. In this case, a metal silicide may be formed on the gate 400.

As yet another lower wiring layer, the diffusion layer 200 is formed. Also in this case, as described above, a metal silicide may be formed on the diffusion layer 200.

Practically, as shown in FIG. 34 described above, a plurality of the lower wiring layers are present at the same time.

On the other hand, as for an upper insulating interlayer 40b, a first Al wiring 60a having a function as the upper wiring layer serves as a lower wiring on the lower layer, and a second Al wiring 60b serves as the upper wiring layer.

As has been described above in detail, according to the present invention, the thin film (via film) formed on at least part of the side wall of the via hole contains a high melting point metal or a high melting point metal compound. No reacted layer such as a layer worsening the characteristic is thus formed between the via plug and the via film by annealing after formation of the via plug. The resistance of the via plug portion is not increased, no mechanical stress acts with a change in volume upon a reaction, and no cavity is formed inside the via hole. Therefore, satisfactory electrical characteristics of the via structure can be maintained.

In addition, the via film can be formed at a relatively low temperature to prevent an adverse effect such as formation of a cavity inside the lower wiring layer. When the via film consists of the above-described material, the via film can be etched at a rate equal to or higher than that of Al or an Al alloy. For this reason, during removal of the film from the bottom portion of the via hole, typical overetching in the lower wiring layer can be prevented. Further, the via film prevents formation of a very firm oxide film such as an alumina film. Therefore, Al deposition on the side wall is uniformly performed without any typical delay. From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device having a multilayered structure including a lower wiring layer that contacts an upper surface of a substrate and an insulating interlayer formed on the lower wiring layer, the method comprising:

forming a via hole in said insulating interlayer;

applying a thin film on at least part of a sidewall of the via hole formed in the insulating interlayer and on an entire upper surface of the insulating interlayer in which the via hole is formed, the thin film including a high melting point metal or a high melting point metal compound selected from the group consisting of a nitride, an oxynitride, a boride, and a boronitride;

entirely removing the thin film from the upper surface of the insulating interlayer; and performing selective chemical vapor deposition to fill the remaining portion of the via hole with a conductive material including one of Al and an Al alloy, thereby forming a via plug.

2. A method according to claim 1, further comprising forming the lower wiring layer including one of Al and an Al alloy film on said upper surface of said substrate.

3. A method according to claim 1, further comprising removing said thin film deposited on a bottom portion of said via hole; and providing said lower wiring layer with a conductive film including one of Al and an Al alloy, and an upper film in contact with an upper side of said conductive film and comprising a high melting point metal or a high melting point metal compound selected from the group consisting of a nitride, an oxynitride, a boride and a boronitride.

4. A method according to claim 3, wherein the forming comprises removing part of said upper film, positioned on said bottom portion of said via hole, and exposing part of said conductive film positioned at said via hole.

5. A method according to claim 3, wherein said forming comprises exposing part of said upper film positioned on said bottom portion of said via hole.

6. A method according to claim 4, further comprising cleansing by applying a cleansing agent to a surface of the thin film after removing the thin film from the insulating interlayer to facilitate the selective chemical vapor deposition.

7. A method according to claim 6, wherein the cleansing comprises performing plasma etching using a chlorine-based gas.

8. A method according to claim 7, wherein said chlorine-based gas used for plasma etching includes $BCl_3$.

9. A method according to claim 4, further comprising forming an upper wiring layer including one of Al and an Al alloy film on said upper surface of said insulating interlayer, wherein said via plug connects said upper wiring layer with said lower wiring layer with no heterogeneous metal interface.

10. A method according to claim 5, wherein the removing further comprises 1) simultaneously removing said thin film deposited on said upper surface of said insulating interlayer and on said bottom portion of said via hole, and, thereafter, 2) removing said exposed portion of said upper film, positioned on said bottom portion of said via hole.

11. A method according to claim 10, further comprising cleansing by applying a cleansing agent to a surface of the thin film after removing the thin film from the insulating interlayer to facilitate the selective chemical vapor deposition.

12. A method according to claim 6, wherein the cleansing comprises performing plasma etching using a chlorine-based gas.

13. A method according to claim 12, wherein said chlorine-based gas used for plasma etching includes $BCl_3$.

14. A method according to claim 10, further comprising forming an upper wiring layer including one of Al and an Al alloy film on said upper surface of said insulating interlayer, wherein said via plug connects said upper wiring layer with said lower wiring layer with no heterogeneous metal interface.

15. A method according to claim 2, further comprising removing said thin film deposited on a bottom portion of said via hole to expose part of said lower wiring layer, positioned on said bottom portion of said via hole.

16. A method according to claim 15, further comprising cleansing by applying a cleansing agent to a surface of the thin film after removing the thin film from the insulating interlayer to facilitate the selective chemical vapor deposition.

17. A method according to claim 14, wherein the cleansing comprises performing plasma etching using a chlorine-based gas.

18. A method according to claim 17, wherein said chlorine-based gas used for plasma etching includes $BCl_3$.

19. A method according to claim 15, further comprising forming an upper wiring layer comprising a conductive material including one of Al and an Al alloy on said upper surface of said insulating interlayer, said upper wiring layer being directly connected with said via plug; with no heterogeneous metal interface.

20. A method according to claim 1, further comprising forming, as said lower wiring layer, a diffusion layer in which an impurity is diffused on said upper surface of said substrate.

21. A method according to claim 20, further comprising maintaining said thin film at least on part of said side wall of said via hole and on an entire bottom portion of said via hole.

22. A method according to claim 21, further comprising cleansing by applying a cleansing agent to a surface of the thin film after removing the thin film from the insulating interlayer to facilitate the selective chemical vapor deposition.

23. A method according to claim 22, wherein the cleansing comprises performing plasma etching using a chlorine-based gas.

24. A method according to claim 23, wherein said chlorine-based gas used for plasma etching includes $BCl_3$.

25. A method according to claim 20, further comprising forming a metal silicide on said diffusion layer formed as said lower wiring layer.

26. A method according to claim 25, further comprising maintaining said thin film on at least part of said side wall of said via hole and on an entire bottom portion of said via hole.

27. A method according to claim 26, further comprising cleansing by applying a cleansing agent to a surface of the thin film after removing the thin film from the insulating interlayer to facilitate the selective chemical vapor deposition.

28. A method according to claim 27, wherein the cleansing comprises performing plasma etching using a chlorine-based gas.

29. A method according to claim 28, wherein said chlorine-based gas used for plasma etching includes $BCl_3$.

30. A method according to claim 1, further comprising removing said thin film deposited on a bottom portion of said via hole.

31. A method according to claim 1, further comprising maintaining said thin film on at least part of said side wall of said via hole and on an entire bottom portion of said via hole.

32. A method according to claim 1, further comprising cleansing by applying a cleansing agent to a surface of the thin film after removing the thin film from the insulating interlayer to facilitate said selective chemical vapor deposition.

33. A method according to claim 32, wherein said cleansing comprises performing plasma etching using a chlorine-based gas.

34. A method according to claim 33, wherein said chlorine-based gas used for plasma etching includes $BCl_3$.

35. A method according to claim 1, further comprising forming an upper wiring layer including one of Al and an Al alloy film on said upper surface of said insulating interlayer, said upper wiring layer being directly connected with said via plug with no heterogeneous metal interface.

36. A method according to claim 1, wherein the thin film is a multilayered film, and wherein the applying includes applying the multilayered film to the insulating interlayer.

37. A method according to claim 36, wherein the applying includes applying a metal selected from the group consisting of Ti, Zr and Hf to form a bottom portion of said multilayered film, and applying a high melting point metal compound selected from the group consisting of a nitride, an oxynitride, a boride, and a boronitride to form a top portion of the multilayered film.

38. A method according to claim 37, wherein the applying includes applying titanium as the metal and applying titanium nitride as the high melting point metal compound.

39. A method according to claim 1, further comprising providing an inner wall of said via hole at an angle within the range of 80°–87° with respect to the surface of said substrate.

40. A method according to claim 1, wherein the filling includes directly contacting the conductive material to the metal compound.

* * * * *